US007668027B2

(12) United States Patent
Imagawa et al.

(10) Patent No.: US 7,668,027 B2
(45) Date of Patent: Feb. 23, 2010

(54) SEMICONDUCTOR DEVICE, TESTING AND MANUFACTURING METHODS THEREOF

(75) Inventors: Kengo Imagawa, Fujisawa (JP); Masami Makuuchi, Yokohama (JP); Ritsuro Orihashi, Tokyo (JP); Yoshiharu Ikeda, Tokorozawa (JP); Koichiro Eguchi, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/365,492

(22) Filed: Mar. 2, 2006

(65) Prior Publication Data
US 2007/0047345 A1     Mar. 1, 2007

(30) Foreign Application Priority Data
Aug. 31, 2005   (JP)   ............................. 2005-251754

(51) Int. Cl.
*G11C 11/00*   (2006.01)

(52) U.S. Cl. ..................................... 365/201; 365/233.5

(58) Field of Classification Search ................. 365/201, 365/233.5
See application file for complete search history.

(56) References Cited

U.S. PATENT DOCUMENTS

| | | | | |
|---|---|---|---|---|
| 5,991,232 | A * | 11/1999 | Matsumura et al. | 365/233.1 |
| 6,650,583 | B2 * | 11/2003 | Haraguchi et al. | 365/201 |
| 6,975,557 | B2 * | 12/2005 | D'Luna et al. | 365/233.13 |
| 6,978,402 | B2 * | 12/2005 | Hirabayashi | 714/42 |
| 7,321,525 | B2 * | 1/2008 | Matsui | 365/233.12 |
| 7,345,933 | B1 * | 3/2008 | Telem et al. | 365/193 |
| 7,373,626 | B2 * | 5/2008 | Ko | 716/6 |
| 7,376,043 | B2 * | 5/2008 | Murayama | 365/194 |
| 7,409,572 | B1 * | 8/2008 | Hung et al. | 713/500 |
| 2002/0012283 | A1 * | 1/2002 | Ernst et al. | 365/201 |
| 2002/0138798 | A1 * | 9/2002 | Stabenau | 714/718 |
| 2002/0170003 | A1 * | 11/2002 | Hirabayashi | 714/42 |
| 2003/0043664 | A1 * | 3/2003 | Haraguchi et al. | 365/201 |
| 2003/0076125 | A1 * | 4/2003 | McCord | 324/765 |
| 2003/0085731 | A1 * | 5/2003 | Iwase et al. | 326/16 |
| 2003/0103394 | A1 * | 6/2003 | Koshikawa | 365/200 |

(Continued)

FOREIGN PATENT DOCUMENTS

JP   2003-98235   4/2003

OTHER PUBLICATIONS

Doc. No. J0234E30 (ver.30)—How to Use DDR SDRAM—issued Apr. 2002, Elpida Memory, Inc.—URL:<http://www_elpida_com/pdf/j0234E30.pdf> (90 pages).

*Primary Examiner*—Michael T Tran
(74) *Attorney, Agent, or Firm*—Antonelli, Terry, Stout & Kraus, LLP.

(57) ABSTRACT

In order to easily perform a timing test on a memory interface included in a semiconductor device so as to satisfy a restriction on latency, the present invention provides a semiconductor device with the memory interface including: a clock output terminal that outputs a clock signal associated with an operation of a memory connected to the memory interface; a command terminal that outputs a command signal associated with control of a state of the memory; a data terminal that exchanges a data signal with the memory; and a data strobe terminal that exchanges a data strobe signal for establishing the data signal. This semiconductor device includes a testing terminal that outputs in advance a signal for starting a test on the memory interface apart from the command signal.

12 Claims, 7 Drawing Sheets

U.S. PATENT DOCUMENTS

| | | | |
|---|---|---|---|
| 2003/0103407 A1* | 6/2003 | Ooishi et al. | 365/233 |
| 2003/0117885 A1* | 6/2003 | Hasegawa et al. | 365/233 |
| 2004/0042312 A1* | 3/2004 | Kim et al. | 365/222 |
| 2004/0136258 A1* | 7/2004 | Ishikawa | 365/230.03 |
| 2004/0160833 A1* | 8/2004 | Suzuki | 365/194 |
| 2005/0073902 A1* | 4/2005 | D'Luna et al. | 365/233 |
| 2005/0149803 A1* | 7/2005 | Hirano et al. | 714/738 |
| 2005/0198542 A1* | 9/2005 | Freker et al. | 713/320 |
| 2005/0283681 A1* | 12/2005 | Jeddeloh | 714/42 |
| 2006/0123281 A1* | 6/2006 | Lung Ko | 714/718 |
| 2007/0058479 A1* | 3/2007 | Matsui | 365/233 |
| 2007/0091710 A1* | 4/2007 | Oh | 365/233 |

* cited by examiner

SEMICONDUCTOR DEVICE, TESTING AND MANUFACTURING METHODS THEREOF

CROSS-REFERENCE TO RELATED APPLICATIONS

The present application claims priority from Japanese application No. JP 2005-251754 filed on Aug. 31, 2005, the content of which is hereby incorporated by reference into this application.

BACKGROUND OF THE INVENTION

1. Field of the Invention

The present invention relates to technologies of a semiconductor device, a testing method and a manufacturing method thereof, etc. and, more particularly, to a semiconductor device technology suitable for testing a high-speed memory interface which the semiconductor device has. Also, the present invention relates to technologies for a method of testing an electric characteristic of a memory interface included in a semiconductor device and a method of manufacturing a semiconductor device with a memory interface.

2. Description of the Related Art

Semiconductor memories widely used in personal computers or various electric appliances are Synchronous Dynamic Random Access Memories (hereinafter referred to as "SDRAMs"). The SDRAM includes a Single Data Rate SDRAM (hereinafter referred to as "SDR-SDRAM") and a Double Data Rate SDRAM (hereinafter referred to as "DDR-SDRAM"), and the high-speed DDR-SDRAM has been widely used. For data exchange with such a DDR-SDRAM, a semiconductor device (semiconductor integrated circuit) has recently incorporated therein a high-speed memory interface (circuit unit).

Operations of a semiconductor device including a memory interface and a semiconductor memory will be briefly described below by using FIGS. 5 to 7, in an exemplary case where the DDR-SDRAM is used as the semiconductor memory.

FIG. 5 depicts a general outline of a connection between a DDR-SDRAM 50 as a semiconductor memory and a semiconductor device 40 with a memory interface supporting that semiconductor memory. Note that unless otherwise specified, the "semiconductor device" means a semiconductor device with a memory interface. The semiconductor device 40 has various signal terminals as a memory interface, such terminals including an operation clock terminal 12 that outputs an operation clock (denoted as "MCLK"), a memory command terminal 13 that outputs a memory command, a data terminal 14 that inputs and outputs data (denoted as "DQ"), and a data strobe terminal 15 that inputs and outputs data strobe (denoted as "DQS"). In normal use, each of the terminals (12 to 15) of the memory interface of the semiconductor device 40 is connected to each corresponding terminal on a side of the DDR-SDRAM 50 via a signal line (transmission line).

MCLK is a clock signal for operation of the DDR-SDRAM 50. The memory command is a command signal for controlling the state of the DDR-SDRAM 50. The memory command comprises a plurality of signal lines and, based on the state of each of these signals (hereinafter "High-and-Low" or "described H/L"), controls the state of the DDR-SDRAM 50, such as data write ("WRITE") and data read ("READ"). The DQ is a signal for data exchange with the DDR-SDRAM 50. The DQS is a signal for determining the DQ and a signal for notification of input/output timing.

Note that, in FIG. 5, for the purpose of simplifying the description of a connection pattern of the semiconductor device 40 with the memory interface and the DDR-SDRAM 50 for general use, a bus representation is not used for each signal and termination resistors between the semiconductor device 40 and the DDR-SDRAM 50 and others are not shown.

FIG. 6 depicts a general outline of signals (including signal input/output timing) when data is written from the semiconductor device 40 to the DDR-SDRAM 50. "T1" and the like represent time. (a) to (d) in FIG. 6 correspond to signals outputted from the relevant terminals of the semiconductor device 40.

(a) MCLK 2 represents a clock signal at a frequency corresponding to the operation speed of the DDR-SDRAM 50, and is outputted from the semiconductor device 40 to the DDR-SDRAM 50. Note that, in the present example, an inverted phase clock is omitted, and the clock signal is represented as one line. (b) memory command 3 in this case is "WRITE" 3a corresponding to a data write state setting signal. (c) DQ 4 represents a write data signal outputted from the semiconductor device 40. D1 to D4 respectively denote write data. (d) DQS 5 is outputted in accordance with DQ 4 to determine timing for establishing DQ 4 in the DDR-SDRAM 50.

From the semiconductor device 40, for example, "WRITE" 3a is outputted as (b) memory command 3 so as to establish a rising edge of MCLK 2 at a time T3 (as represented by a triangle in the drawing). The DDR-SDRAM 50 receiving "WRITE" 3a makes a transition to a data write state. When the memory interface supports the DDR-SDRAM, the semiconductor device 40 outputs (c) DQ 4 and (d) DQS 5 after outputting "WRITE" 3a (T3) and one clock after MCLK 2 (T4). The DDR-SDRAM 50 receives these DQ 4 and DQS 5, internally latches DQ 4 at timing of DQS 5 (rising and trailing), and then retains each piece of data (D1 to D4).

As for a relation between DQ 4 and DQS 5 in the DDR-SDRAM 50, a set-up time tDS and a hold time tDH are defined. This timing definition, the memory interface of the DDR-SDRAM 50, and others are standardized by Joint Electron Device Engineering Council (hereinafter referred to as "JEDEC"), which is a US industrial organization for facilitating standardization of electronic components.

FIG. 7 depicts a general outline of signals when the semiconductor device 40 reads data from the DDR-SDRAM 50 to the semiconductor device 40. As with the above, (a) MCLK 2 represents a clock signal at a frequency corresponding to the operation speed of the DDR-SDRAM 50. (b) memory command 3 in this case is "READ" 3b corresponding to a data read state setting signal. (c) DQ 4 represents a read data signal outputted from the DDR-SDRAM 50. D1 to D4 respectively denote read data. (d) DQS 5 is outputted in accordance with DQ 4 to determine timing for establishing DQ 4 in the semiconductor device 40.

From the semiconductor device 40, for example, "READ" 3b is outputted as (b) memory command 3 so as to establish a rising edge of MCLK 2 at a time T3 (as represented by a triangle in the drawing). The DDR-SDRAM 50 receiving "READ" 3b makes a transition to a data read state, that is, a retained data output state. Then, the DDR-SDRAM 50 outputs (c) DQ 4 (for example, retained data at the time of writing data) and (d) DQS 5 in synchronization with (a) MCLK 2. The semiconductor device 40 then receives these (c) DQ 4 and (d) DQS 5, and retains DQ 4 at timing of DQS 5.

When DQ 4 is read from the DDR-SDRAM 50, as for its read timing, apart from the set-up time and the hold time as described above regarding the time of data writing, there is a timing definition of "/CAS latency" (hereinafter abbreviated as "CL" and, particularly, also as "/CAS read latency", where "/" represents a sign indicative of an inverted phase). "CAS" is an abbreviation of column address strobe. For example, in the case of DDR-SDRAM 50 of the type defined as CL=2, there is a restriction in which, DQ 4 and DQS 5 have to arrive at the semiconductor device 40 by two rising edges of MCLK 2, that is, at a time T5 after (b) "READ" 3b of the memory command 3 is outputted. In FIG. 7, for example, an example of the case of CL=2 is shown.

Also, in FIGS. 6 and 7, four consecutive pieces of data D1 to D4 are shown as DQ 4. This is defined by a burst length (hereinafter abbreviated as "BL") of the DDR-SDRAM (50), and, by way of example, the case of being defined as BL=4 is shown. The consecutive pieces of data (DQ 4) for BL defined in the DDR-SDRAM (50) are collectively received.

There are a plurality of types of the DDR-SDRAM 50 depending on the elements including CL, BL, and further the operation speed (clock frequency of MCLK 2). The memory interface of the semiconductor device 40 is one suitable for the type of the semiconductor memory (DDR-SDRAM 50) to be connected.

Note that detailed specifications of the above-described memory (DDR-SDRAM) and memory interface and others are described in "Usage of DDR SDRAM—User's Manual", Document No. J0234E30 (Ver. 30), issued on April, 2002, Elpida Memory, Inc., URL:
<http://www.elpida.com/ja/products/index.html>,
<http://www.elpida.com/pdf/j0234E30.pdf>.

In the test on the memory interface of the semiconductor device 40 as described above, a test on timing that complies with the specifications of the JEDEC is required due the way of usage described above. Subjects of the timing test may include the set-up time/hold time, as well as whether CL is satisfied.

In general, for electric characteristic tests on the semiconductor device, some type of semiconductor device or semiconductor test system is used. However, the memory interface of the semiconductor device has a high-speed data transfer rate such as 400 Mbps, and is therefore required to be tested by a semiconductor testing device operable at a high speed. Moreover, if the data transfer rate is 400 Mbps, for example, one data width is 2.5 ns (=1/400 Mbps), and therefore the set-up time/hold time is 1.25 ns. Also, if it is assumed that a timing test is required to be performed with precision of one-tenth of the set-up time/hold time, a semiconductor testing device guaranteed with timing precision of 125 ps is required.

However, such a semiconductor testing device operable at a high speed and with high timing precision is extremely expensive in comparison with general semiconductor testing devices, thereby posing a problem that manufacturing costs of semiconductor devices cannot be reduced.

Japanese Patent Laid-Open Publication No. 2003-98235 discloses a technology for conducting a timing test on a memory interface by using a semiconductor testing device with an operation speed slower than the memory interface included in a semiconductor device.

SUMMARY OF THE INVENTION

Between a semiconductor device including a memory interface and a semiconductor memory, a delay occurs due to transmission lines or other factors. In the memory interface of the semiconductor device, as described in the Related Art section, in addition to restrictions on the set-up time/hold time, those on CL or the like have to be particularly satisfied. To check whether these restrictions are satisfied, a timing test on the memory interface is desired to be performed.

In particular, the restriction on CL has to be satisfied when a test is performed in the case where a semiconductor device receives data from memory (where the semiconductor device 40 under normal use reads data (DQ 4) from the DDR-SDRAM 50) (such a test is hereinafter referred to as a "data reading test"). In the case of a data reading test, a command and its response (read data) travel back and forth on a transmission line, and therefore restrictions are stricter than those in the case of data writing.

For example, when a test on a memory interface, particularly a data reading test, is performed by using the technology disclosed in Patent Document 1, there is a problem in satisfying the restriction on CL. This problem will be described below by using FIGS. 8 and 9.

FIG. 8 depicts one example of a connection configuration of the semiconductor device 40 and the DDR-SDRAM 50 when a memory interface test is performed on the semiconductor device 40 with a memory interface supporting the DDR-SDRAM 50 (as shown in FIG. 5), by using the technology disclosed in Patent Document 1. In the configuration of FIG. 8, for the purpose of describing the details of the problem, transmission lines and others are added to FIG. 5 for illustration.

The semiconductor device 40 and the semiconductor memory (DDR-SDRAM) 50 are connected to each other via transmission lines 31a, 31b, 31c, 32, and 33, and delay means 30. The delay means 30 is interposed between the transmission line 32 and the transmission line 33. The reference numerals "52" to "55" denote terminals corresponding to the terminals (12 to 15) on a side of the semiconductor device 40. The transmission lines herein mean those for electrical connection, such as cables or pattern wirings on a board. As in the technology disclosed in Patent Document 1, for connection between the semiconductor device and the DDR-SDRAM, at least a transmission line with a propagation delay time is present. It is assumed that a delay time amount in the transmission lines 31a to 31c is taken as "Td1". Also, it is assumed that a delay time amount in the transmission line 32 is taken as "Td2", and a delay time amount in the transmission line 33 is taken as "Td3". Furthermore, it is assumed that a delay time amount by the delay means 30 is taken as "Tpd=Td0+ΔT".

In the example of the SDR-SDRAM used in the description in Patent Document 1, delay means is disposed on a clock wiring so as to latch data (DQ) at a memory operation clock (represented simply as a "clock signal" in Patent Document 1).

In the case of the DDR-SDRAM, data (DQ) is latched at the timing of a data strobe (DQS). That is, the data strobe terminals 15 and 55 are required. Therefore, in FIG. 8, the delay means 30 is disposed on a DQS signal line (between "15" and "55").

FIG. 9 depicts time changes in signals when a data reading test is performed in the configuration of FIG. 8 in a manner similar to that in FIG. 7 and other drawings. (a) and (b) depict output signals from the terminals of the semiconductor device 40. (c) and (d) depict signals satisfying the restriction on CL. (e) and (f) depict input signals of the terminals of the DDR-SDRAM 50, that is, signals from the semiconductor device 40 being delayed. (g) and (h) depict output signals of the terminals of the DDR-SDRAM 50. (i) and (j) depict input signals of the terminals of the semiconductor device 40, that is, signals from the semiconductor device 40 being delayed. It is assumed that CL=2 and BL=4 are provided as the restrictions on the memory interface between the semiconductor device 40 and the DDR-SDRAM 50.

It is assumed that (a) MCLK 2 is outputted from the operation clock terminal 12 of the semiconductor device 40 and, as (b) memory command 3, "READ" 3b corresponding to a data read state setting signal is outputted at a time T3 from the memory command terminal 13 of the semiconductor device 40. In this case, as a response to the memory command 3, DQ 4c and DQS 5c from the DDR-SDRAM 50 have to arrive at the semiconductor device 40 at timing of a time T5 due to CL=2, as shown in (c) DQ 4c and (d) DQS 5c.

However, as shown in (i) DQ 4, (j) DQS 5, and a delay amount L, the timing of CL may not be satisfied in any cases. For example, (a) MCLK 2 and (b) memory command 3 ("READ" 3b) outputted from the semiconductor device 40 arrive at the DDR-SDRAM 50 with a delay by a time Td1 due to the transmission lines 31a and 31b in FIG. 8, as shown in (e) MCLK 2d and (f) memory command of "READ" 3d. Here, a time delayed by the time Td1 with respect to the time T3 or the like is represented as "T3'" or the like.

It is assumed that the DDR-SDRAM 50 receives and interprets "READ" 3b of the memory command and, in response thereto, outputs (g) DQ 4d and (h) DQS 5d to the semiconductor device 40. DQ 4d from the DDR-SDRAM 50 is delayed by the time Td1 due to the transmission line 31c as shown in FIG. 8, whilst DQS 5d is delayed by a time "Td3+Tpd+Td2" due to the transmission line 33, the delay means 30, and the transmission line 32. Therefore, as shown in (i) DQ 4 and (j) DQS 5, the output signals arrive at the semiconductor device 40 as being delayed. FIG. 9 shows the case where the restriction on CL cannot be satisfied due to such delays, that is, as shown by the delay amount L from the output time of the "READ" 3b, the case where CL is over 2. In the above, the following equation (1) is satisfied (so as to meet signal timing):

$$Td1 = Td3 + Tpd + Td2 \qquad \text{Equation (1).}$$

To satisfy the restriction on CL, the type of the transmission lines of FIG. 8 may be changed or the length thereof may be adjusted, whereby the delay times Td1, Td2, and Td3 can be changed. However, as for the delay means 30, when a general component is used, a fixed delay amount Td0 of several ns is present. Therefore, as the data transfer rate of the memory (DDR-SDRAM 50) is increased, it is getting more difficult to achieve the test through the technology disclosed in Patent Document 1. For example, with the data transfer rate of next-generation memory being 800 Mbps, a clock cycle is 2.5 ns and a data width is 1.25 ns. Assuming for example that the fixed delay amount of the delay means is 2.5 ns, the time is equivalent to the time in the case of CL=2 only with this delay means (2.5 ns×2=5 ns) from the condition in Equation (1), and therefore the restriction on CL is not satisfied. In the technology disclosed in Patent Document 1, it is difficult to perform a timing test so as to satisfy the restriction on CL.

As described above, in the conventional technology, with the increase of the operation speed of the memory, it is difficult to perform a timing test on a memory interface to satisfy restrictions on CL and others.

Moreover, as described above, there are DDR-SDRAMs with various operation speeds, and there are also a plurality of types of CL and other components in the memory interface. Therefore, there are a plurality of combinations of the operation speed and CL. To comply with this, there are also a plurality of types of semiconductor devices. For this reason, in the technology disclosed in Patent Document 1, a dedicated testing circuit has to be provided for each type, whereby there is the problem such that costs cannot be reduced. Furthermore, under these restrictions on CL and others, there is also the problem such that the testing circuit cannot be disposed at an arbitrary position and thereby flexibility thereof is reduced.

Still further, in the technology disclosed in Patent Document 1, the semiconductor memory is connected to the semiconductor device for testing and therefore the characteristic of the semiconductor memory itself becomes a standard for testing. This poses the problem such that testing precision depends on the precision of the semiconductor memory.

The present invention is made in view of the above problems, and an object of the present invention is to provide a semiconductor device and testing and manufacturing methods thereof associated with a testing of a memory interface which a semiconductor device has for a semiconductor memory, wherein a timing test is easily performed so as to satisfy delay restrictions on CL and others. In particular, an object is to provide a technology for supporting the case where the operation speeds of the semiconductor memory and the memory interface are improved and the case of a plurality of types of memory interfaces and for being capable of conducting the timing test at low costs and also reducing manufacture costs of the semiconductor device.

Outlines of representative ones of the inventions disclosed in the present invention will be brief described as follows. To achieve the above objects, the present invention is a technology associated with: a semiconductor memory (restated also as a semiconductor storage device or the like) such as a DDR-SDRAM; a semiconductor device with a memory interface (restated also as a memory interface circuit unit or a memory control unit or the like) for the memory; and testing means, such as a testing circuit, which performs a test on the memory interface of the semiconductor device, and the present invention has the following features. The test on the memory interface is one for manufacturing a semiconductor device complying with predetermined standards, and particularly includes a timing test.

(1) A semiconductor device according to the present invention is a semiconductor device comprising a memory interface including at least: a clock output terminal that outputs a clock signal (MCLK) for causing a memory to operate; a command terminal (restated also as a memory command output terminal or the like) that outputs a command signal (memory command) for controlling a state of the memory; and a data terminal that exchanges a data signal (DQ) with the memory. The semiconductor device includes, apart from the command terminal, a terminal (called a testing terminal or a memory interface test start signal output terminal or the like) that outputs or inputs/outputs in advance a signal (TEST called a test signal or a memory interface test start signal or the like) for starting a test on the memory interface of the semiconductor device, particularly for starting a timing test. The test signal may be exemplarily restated also as a signal for defining the start of the test, or a signal for reporting the start of the test to an external component.

In a system in which the semiconductor device and testing means such as a testing circuit are connected to each other via a transmission line or the like, the testing means which has inputted the test signal from the semiconductor device performs (starts) the test on the memory interface of the semiconductor device. That is, by using the test signal, a command sequence (from issuance of a command signal to completion of a processing) is tested.

(2) Also, a testing method according to the present invention is a testing method for a memory interface of a semiconductor device, the memory interface including at least a clock output terminal, a command terminal, and a data terminal, wherein, apart from the above command signal, a test signal (memory interface test start signal) for starting a test (particularly, a timing test) on the memory interface is outputted in advance from the semiconductor device to an external component (testing means) and, based on this test signal, the external component (testing means) performs the test on the memory interface of the semiconductor device by exchanging a signal for test with the semiconductor device if required.

(3) Furthermore, in another testing method according to the present invention, a test is performed similarly by using a configuration in which a testing terminal is provided in an external device (semiconductor testing device, for example). That is, the present invention is a testing method of the semiconductor device with the memory interface, wherein apart from testing means such as a testing circuit connected to the semiconductor device for performing a test on the memory interface, for example, in a configuration including a semiconductor testing device (general semiconductor testing device 100 shown in FIG. 4), a test signal for starting the test on the memory interface is outputted or inputted/outputted in advance from a terminal (testing terminal, for example) of the semiconductor testing device to the testing means apart from a command signal of the memory interface of the semiconductor device, and, with the outputted or inputted/outputted test signal being inputted to the testing means for exchanging a signal for testing with the semiconductor device, the test on the memory interface of the semiconductor device is performed.

(4) Still further, the semiconductor device is a semiconductor device with a memory interface including at least a clock output terminal, a command terminal, and a data terminal, wherein for a test on the memory interface, a testing terminal that outputs or inputs/outputs in advance a signal corresponding to a command signal ("WRITE" or "READ") for data writing or data reading outputted from the command terminal is included apart from the command terminal.

(5) Still further, a manufacturing method according to the present invention is a method of manufacturing a semiconductor device with a memory interface, the method including a step of performing a test in accordance with the testing method. The manufacturing method includes the steps of: apart from a command signal, outputting or inputting/outputting in advance a test signal for starting a test (particularly, a timing test) on the memory interface from a terminal of the semiconductor device; performing, by testing means, the test on the memory interface of the semiconductor device based on an input of the test signal; and determining quality of the memory interface.

(6) Still further, at the time of the timing test on the memory interface, the test signal (signal for starting a timing test on the memory interface or signal corresponding to the command signal) is outputted from a testing terminal in consideration of a delay time occurring on a transmission line or the like, the testing terminal being outputted at timing different from timing of the command signal, the timing in which a restriction on latency, e.g., CAS latency, in transmission of at least one signal including the command signal (for example, a sequence from issuance of the command signal to reception of its response signal) is satisfied.

Effects obtained from typical ones of the inventions disclosed in the present application will be briefly described as follows. According to the present invention, it is possible to provide a technology for a semiconductor device and its testing method in which a timing test is easily performed in the memory interface so as to satisfy delay restrictions on CL and others. In particular: (1) even when the operation speed of the memory is increased or the case of a plurality of types of memories and memory interfaces, a timing test in which the restrictions on CL and others are satisfied can be easily performed; (2) since an expensive, high-speed testing device or system with high timing precision is not required, a test can be achieved at low costs; and (3) manufacturing costs of the semiconductor device can be reduced.

DESCRIPTION OF THE PREFERRED EMBODIMENTS

Figure 1:
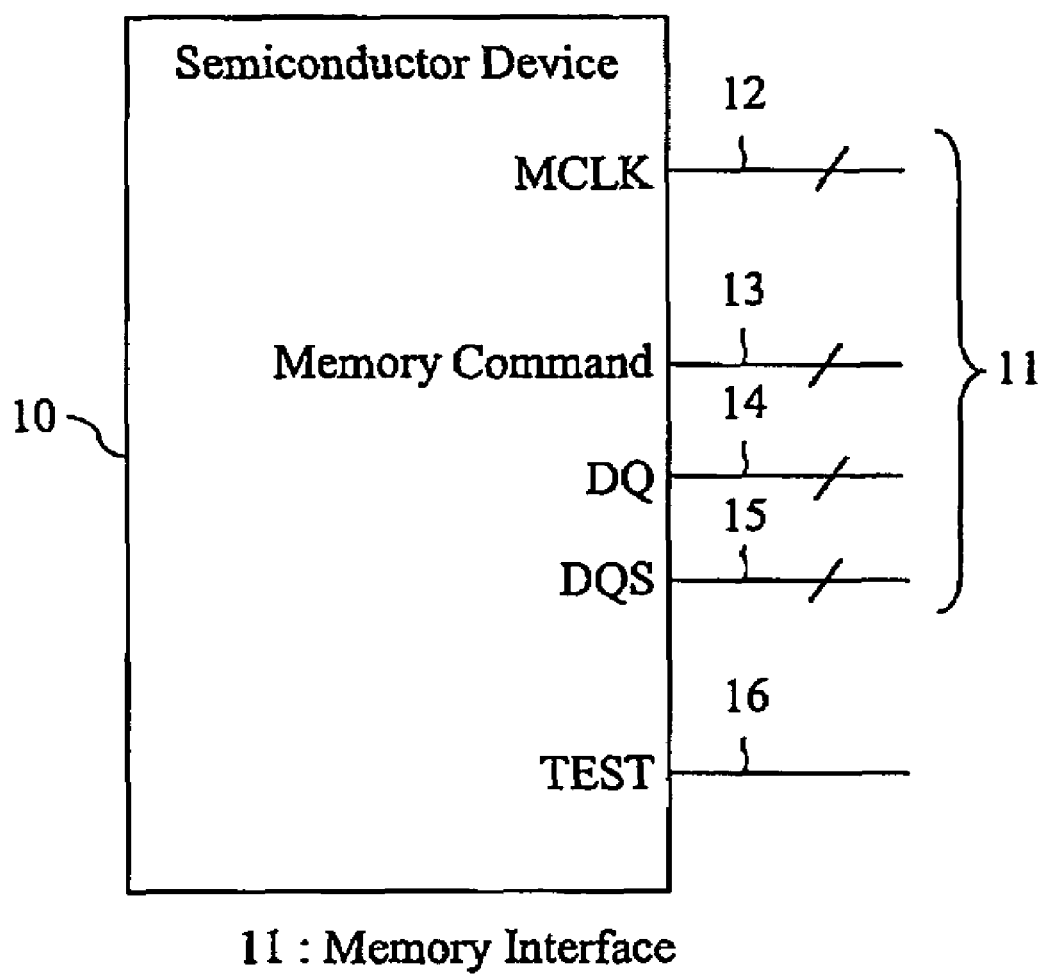
FIG. 1 is a view showing a configuration of a semiconductor device according to a first embodiment of the present invention.

Embodiments of the present invention will be described in detail below based on the drawings. Note that, in all the drawings for describing the embodiments, the same portions are in principle denoted by the same reference numerals and will not be repeatedly described. FIGS. 1 to 4 are views for describing the present embodiments. FIGS. 5 to 9 are views for describing the conventional art.

First Embodiment

FIG. 1 depicts a semiconductor device 10 according to a first embodiment of the present invention. The semiconductor device 10 according to the first embodiment includes a memory interface 11 and a testing terminal 16. The memory interface 11 includes a clock output terminal (operation clock terminal) 12, a command terminal (memory command terminal) 13, a data terminal 14, and a data strobe terminal 15. Note that a terminal for input/output of another known signal may be included.

In a testing method according to the first embodiment, by a test signal outputted from the testing terminal 16 of the semiconductor device 10, a test including a timing test on the memory interface 11 is performed.

The clock output terminal 12 outputs a clock signal (MCLK) for causing a memory, such as a DDR-SDRAM, connected to the semiconductor device 10 to operate. The command terminal 13 outputs a memory command signal for controlling a state of the memory. The data terminal 14 inputs and outputs a data signal (DQ). The data strobe terminal 15 inputs and outputs a data strobe signal (DQS) for determining the data signal (DQ).

The testing terminal 16 outputs a test signal (denoted as the symbol "TEST"). This test signal is a memory interface test start signal, and is a signal for causing a test on the memory interface 11 to start externally. With this test signal, apart from the command signal, a start of the test on the memory interface 11 is reported to external testing means (such as the testing circuit 20 in FIG. 2) to cause the test to be performed by that testing means.

Although a plurality of signal lines from the respective terminals of the memory interface 11 are depicted, such a plurality of signal lines are not intended to be restrictive. In the present embodiment, although being respective ones, the number of single testing terminal 16 and that of single testing line may be two or more. Correspondingly to the testing circuit 20, a configuration in which the number of terminals, a signal scheme, and others are modified may be used. For example, in addition to the case where a test signal is outputted from the testing terminal 16, a signal for control relating to a test may be externally inputted to the testing terminal 16.

Figure 2:
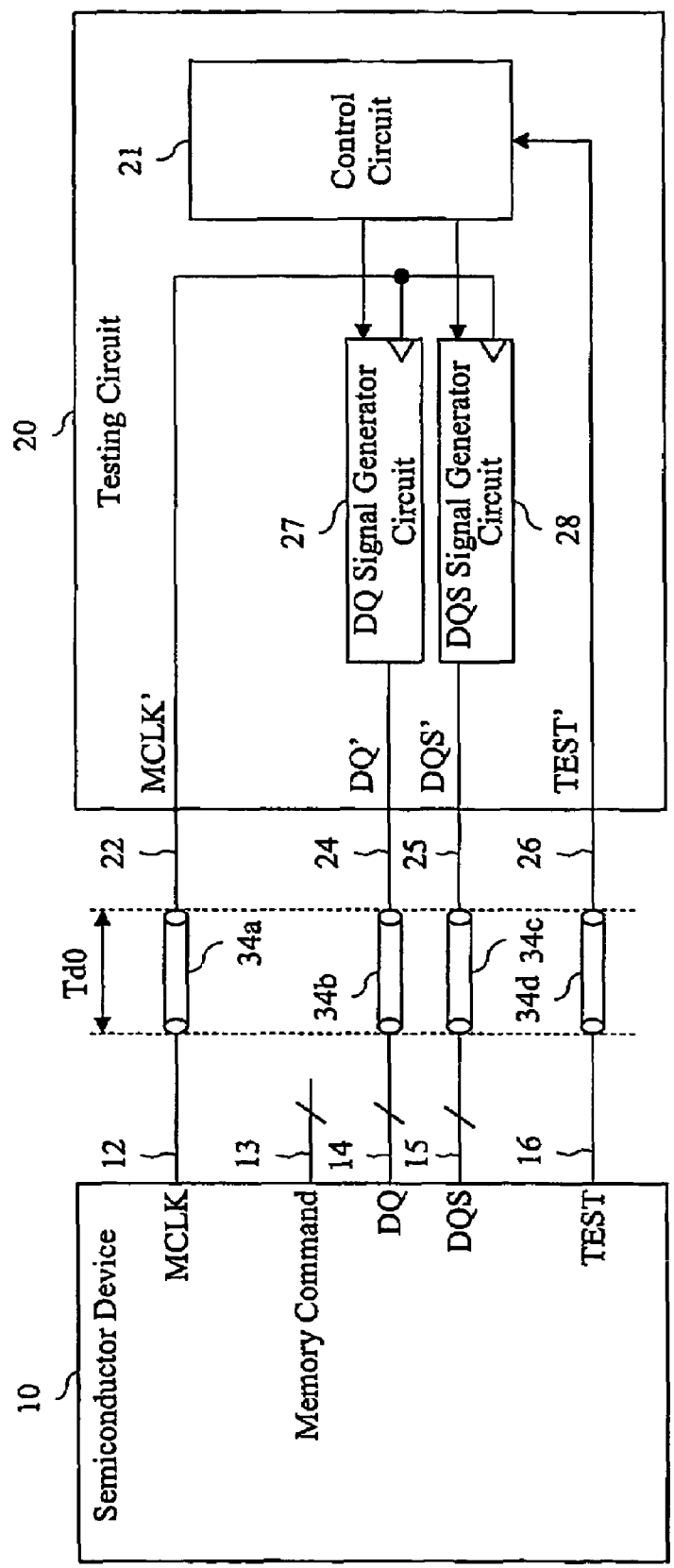
FIG. 2 is a view showing an exemplary configuration of a testing circuit and a configuration of a testing system in which the semiconductor device and the testing circuit are connected to each other, according to the first embodiment of the present invention.

FIG. 2 depicts one example of a configuration of the semiconductor device 10 and its testing circuit 20, as a system according to the first embodiment. The semiconductor device 10 is connected to the testing circuit 20 via the transmission lines 34a to 34d. Note that the command terminal 13 and its signal line are not necessarily connected to a side of the testing circuit 20 and therefore the transmission line is omitted. As described above with reference to FIG. 8, the transmission lines 34a to 34d are ones for being electrically connected between terminals, and its delay time amount is denoted herein as "Td0".

The testing circuit 20 includes a control circuit 21, a DQ signal generator circuit 27, and a DQS signal generator circuit 28. The first embodiment is different from the technology disclosed in Patent Document 1 in that a memory command signal from the command terminal 13 is not used in the testing circuit 20 and that the testing circuit 20 operates based on a test signal outputted from the testing terminal 16 of the semiconductor device 10.

In the system and testing method according to the first embodiment, instead of connecting a memory to the semiconductor device 10 to test the memory interface 11, the testing circuit 20 is connected for testing.

In the testing circuit 20, terminals (22 and 24 to 26) are provided for inputting or inputting/outputting the signals {MCLK', DQ', DQS', TEST'} corresponding to the signals {MCLK, DQ, DQS, TEST} from the respective terminals (12 to 16) on a side of the semiconductor device 10. Note that since testing is possible without using a memory command signal, a corresponding memory command terminal in the testing circuit 20 is not shown.

In the testing circuit 20, the clock signal (MCLK') from the clock input terminal 22 is inputted to the DQ signal generator circuit 27 and the DQS signal generator circuit 28. The data terminal 24 and the DQ signal generator circuit 27 are connected to each other. The data strobe terminal 25 and the DQS signal generator circuit 28 are connected to each other. The testing terminal 26 and the control circuit 21 are connected to each other, and a test signal (TEST') is inputted from the testing terminal 26 to the control circuit 21. Based on the test signal (TEST'), the control circuit 21 outputs a signal to each of the DQ signal generator circuit 27 and the DQS signal generator circuit 28 for generating the relevant signal. From the DQ signal generator circuit 27, the signal DQ' is generated and outputted from the data terminal 24. From the DQS signal generator circuit 28, the signal DQS' is generated and outputted from the data strobe terminal 25. As such, based on the input of the test signal (TEST'), a test on the memory interface 11 is performed.

Figure 3:
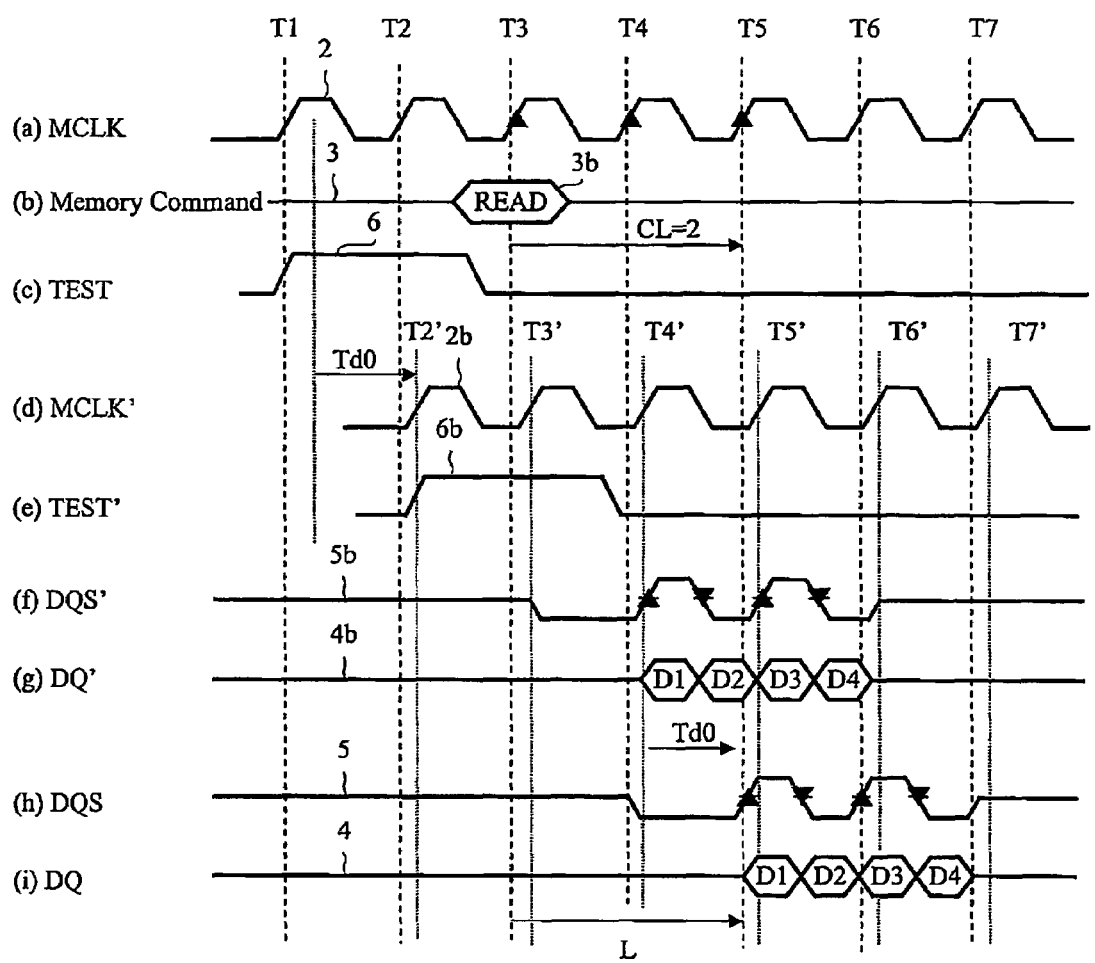
FIG. 3 is a view for explaining an operation including signal timing of a testing system shown in FIG. 2, according to the first embodiment of the present invention.
Figure 7:
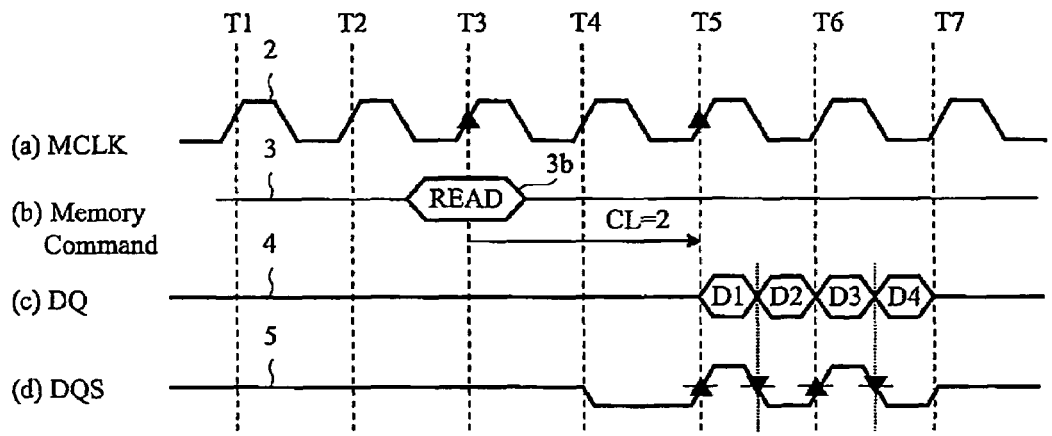
FIG. 7 is a view showing an operation in the conventional technology at a time when the semiconductor device shown in FIG. 4 receives data from the semiconductor memory, particularly at the time of data reading.
Figure 8:
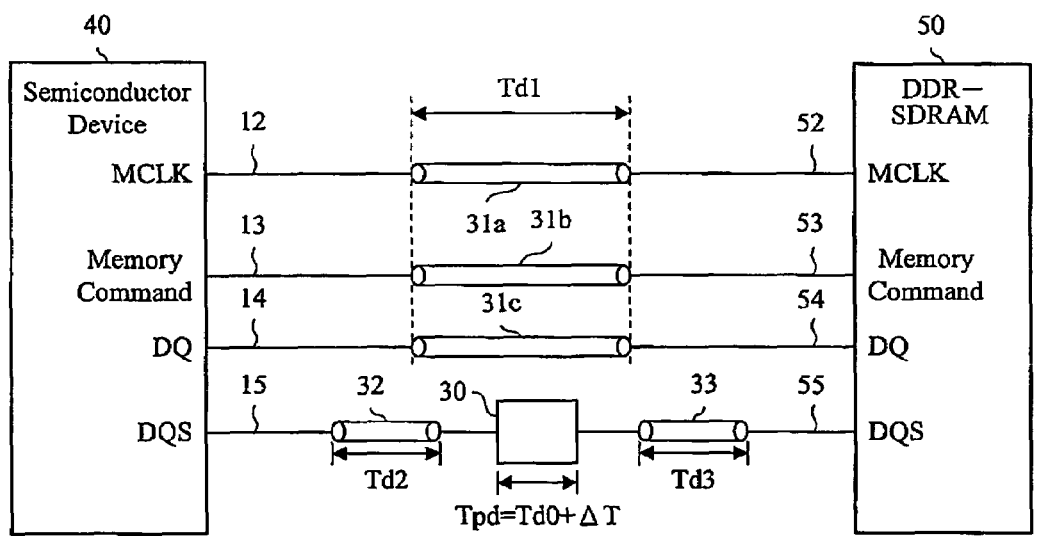
FIG. 8 is a view showing an example of a configuration of a system in which a semiconductor device and a semiconductor memory are connected to each other in the conventional technology.
Figure 9:
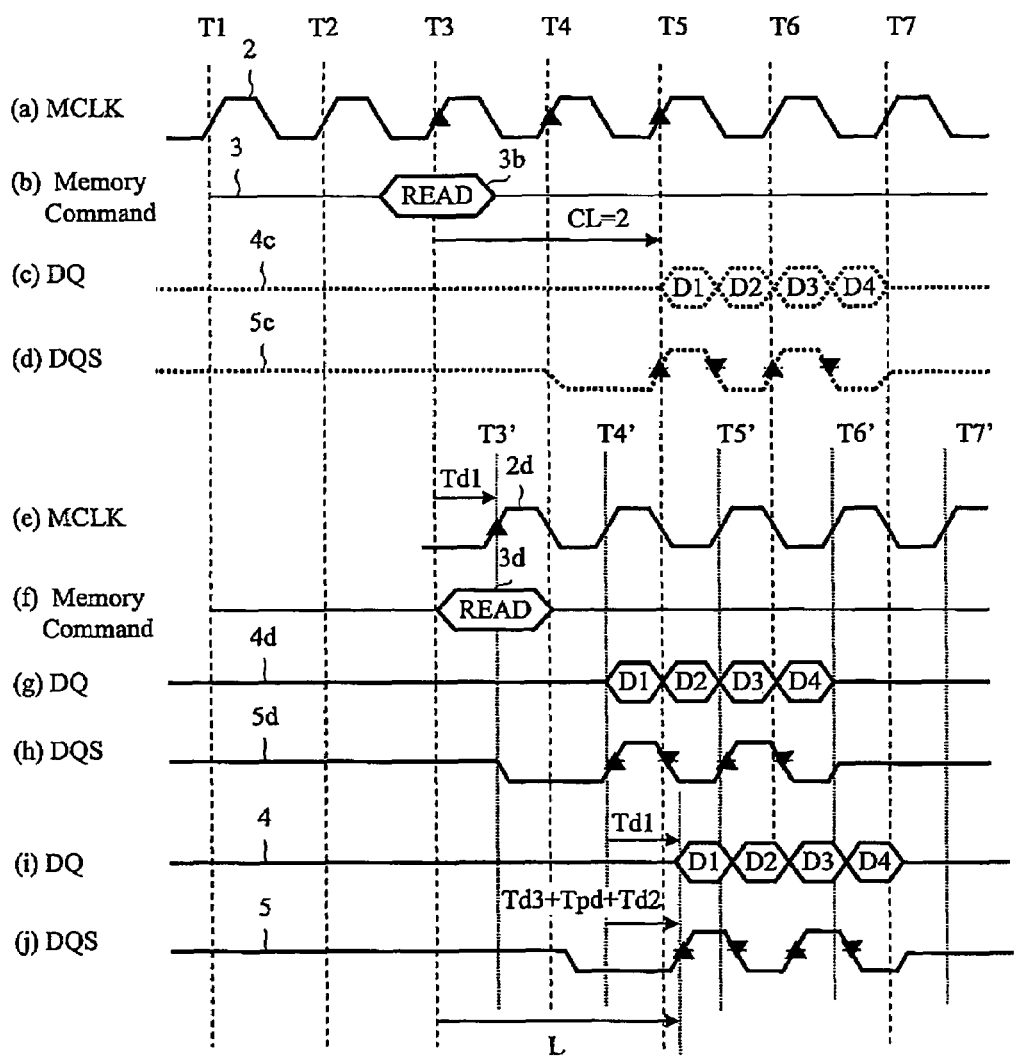
FIG. 9 is view for explaining a problem of the operation of the system shown in FIG. 7 in the conventional technology, particularly at the time of reading.

For specific description, FIG. 3 depicts temporal changes of the respective signals in the testing circuit 20 and the semiconductor device 10 of FIG. 2 in a manner similar to FIG. 7 and other drawings. FIG. 3 shows temporal changes of the signals when a data reading test is performed in the configuration of FIG. 2. (a), (b), and (c) depict output signals from the terminals of the semiconductor device 10. (d) and (e) depict input signals from a terminal of the testing circuit 20, that is, signals from the semiconductor device 10 being delayed. (f) and (g) depict output signals from the terminals of the testing circuit 20. (h) and (i) depict input signals of terminals of the semiconductor device 10, that is, signals from the testing circuit 20 being delayed. As restrictions on the memory interface 11 of the semiconductor device 10, it is assumed that the memory interface 11 is of the types of CL=2 and BL=4.

As shown in (a) to (c), the semiconductor device 10 outputs the respective signals of MCLK 2, memory command 3 ("READ" 3b), and TEST 6 to the testing circuit 20. In a data reading test shown in this example, it is assumed to support the case where "READ" 3b is outputted as a memory command 3 at a time T3. In the testing circuit 20, "READ" 3b is not used, but TEST 6 is used. For example, to satisfy the restriction of CL=2, it is required that the signals DQ and DQS outputted from the testing circuit 20 arrive at the semiconductor device 10 at the timing of the time T5.

Apart from (b) of the memory command 3 of "READ" 3b, the semiconductor device 10 issues (c) TEST 6 at the timing in the DQS signal generator circuit 28 at timing in expectation of, for example, a delay between the semiconductor device 10 and the testing circuit 20. Herein, a signal as TEST 6 is outputted from the testing terminal 16 so as to rise at timing of a time T1 and fall after an H state for one or more rising clock cycle. With the H state of TEST 6, the start of the timing test on the memory interface 11 is reported to the testing circuit 20.

As shown in (d) MCLK' 2b and (e) TEST' 6b, the signals of (a) MCLK 2 and (c) TEST 6 from the semiconductor device 10 are delayed by the time Td0 due to the transmission lines 34a and 34d as shown in FIG. 2, respectively, to arrive at the testing circuit 20. The control circuit 21 of the testing circuit 20 receives the signal (TEST 6b) from the testing terminal 16 of the semiconductor device 10, via the testing terminal 26, and then issues output signals to the DQ signal generator circuit 27 and the DQS signal generator circuit 28.

Then, as shown in (f) DQS' 5b and (g) DQ' 4b, the testing circuit 20 generates the signals DQ' 4b and DQS' 5b at the DQ signal generator circuit 27 and the DQS signal generator circuit 28, respectively, for output to the semiconductor device 10. In a cycle (T3') after a cycle (T2') in which (e) TEST' 6b is in an H state, DQS' 5b first becomes in a preamble state and then becomes, at the subsequent cycle (T4'), in an H/L state corresponding to D1 to D2 of DQ' 4b and in a post-ample state.

Both signals (4b and 5b) outputted from the testing circuit 20 arrive at the semiconductor device 10 at timing of the time T5 with a further delay of the time Td0 due to the transmission lines 34b and 34c, as shown in (h) DQS 5 and (i) DQ 4, respectively. In this way, as shown in an amount of delay L from the time (T3) of issuance of "READ" 3b, the restriction on CL, that is, CL=2 can be satisfied.

That is, in the first embodiment, in expectation of a delay time due to the transmission lines 34a to 34d, command interpretation in the testing circuit 20, and other factors, TEST 6, which is a memory interface test starting signal corresponding to the memory command 3, such as "READ" 3b, is outputted from the testing terminal 16 of the semiconductor device 10. Thereby, the restriction on CL can always be satisfied.

Furthermore, variable means (delay means as disclosed in Patent Document 1) capable of varying the amount of delay may be provided in the testing circuit 20 or between the semiconductor device 10 and the testing circuit 20. With the use of this means, a test for checking the set-up time/hold time can be performed as a timing test.

Still further, a function capable of adjusting an output timing of the output signal (TEST 6) from the testing terminal 16 may be provided in the semiconductor device 10. In this case, independently of the frequency of the operation clock (MCLK) or the type of CL, the same testing circuit 20 can be used to achieve a timing test with the restriction on CL being satisfied. Also, even if the operation speed of the memory is further improved in the future, a timing test on the memory interface 11 can be easily achieved with the restriction on CL being satisfied.

Nota that the above-described function capable of adjusting the output timing is not necessarily provided in the semiconductor device 10. Under the condition that the memory interface test start signal (TEST 6) is outputted in advance apart from the memory command 3, the above-described timing adjusting means may be provided in the testing circuit 20 or between the semiconductor device 10 and the testing circuit 20.

Still further, in the first embodiment, the memory command 3 is not necessarily received at the testing circuit 20, and a circuit for determining the memory command in the testing circuit 20 is not required. Therefore, the size of the testing circuit 20 can be made small. Still further, since an expensive testing device with high timing precision is not required, a memory interface test in the semiconductor device 10 can be achieved at low costs. As a result, the manufacturing costs of the semiconductor device 10 can be reduced.

In the present embodiment, one object of the first embodiment is to perform, irrespective of the testing circuit 20 (testing means), a timing test with the restriction on CL being satisfied in the semiconductor device 10 provided with the memory interface 11 in synchronization with the operation clock (MCLK) outputted by the semiconductor device 10. To achieve this, the semiconductor device 10 is provided with the testing terminal 16 for outputting in advance a memory interface test start signal for the testing circuit 20, apart from the command signal from the command terminal 13 of the memory interface 11. This does not restrict the configuration of the testing means, such as the testing circuit 20 of the memory interface 11. Therefore, the testing circuit 20 is not restricted to have the configuration shown in FIG. 2, but can may have a configuration with a change or a function being added, and another testing device may also be used. Although the data reading test ("READ" test) has been exemplarily shown and described in the present embodiment, the invention may also be used similarly for a data writing test ("WRITE" test).

Still further, although the operation setting and control of the semiconductor device 10 are not particularly described and shown, any semiconductor testing device, testing system, arbitrary testing circuit, and others that are generally used for a semiconductor electric test may be used. In the first embodiment, the semiconductor device 10 with the high-speed memory interface 11 including the DDR-SDRAM 50 as a semiconductor memory has been exemplarily described. However, the present invention can be applied similarly to an SDR-SDRAM and its interface, for example. Also, the DDR-SDRAM herein includes all of a DDR-SDRAM, a DDR2-SDRAM, and a DDR3-SDRA which is a next-generation memory, they being standardized by JEDEC, and the present invention can be applied to any of these memories. All of these points can apply to another embodiment, although not particularly described.

Second Embodiment

Figure 4:
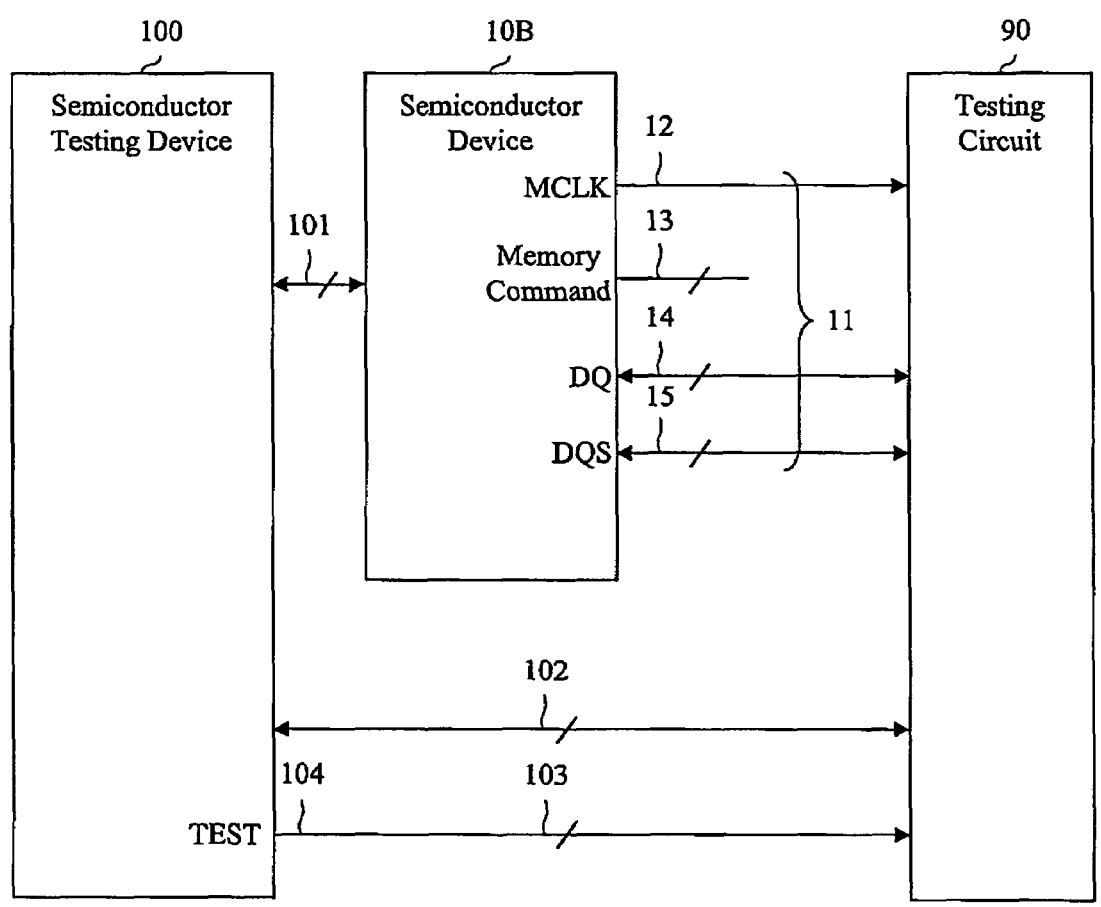
FIG. 4 is a view showing a configuration of a testing system in which a semiconductor device, a testing circuit, and a semiconductor testing device are connected to one another, according to a second embodiment of the present invention.
Figure 5:
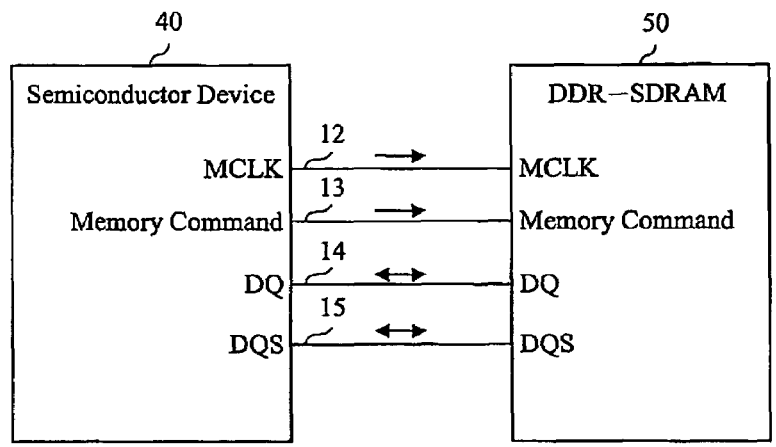
FIG. 5 is a view showing a connecting relation between a semiconductor device and a semiconductor memory in a conventional technology.
Figure 6:
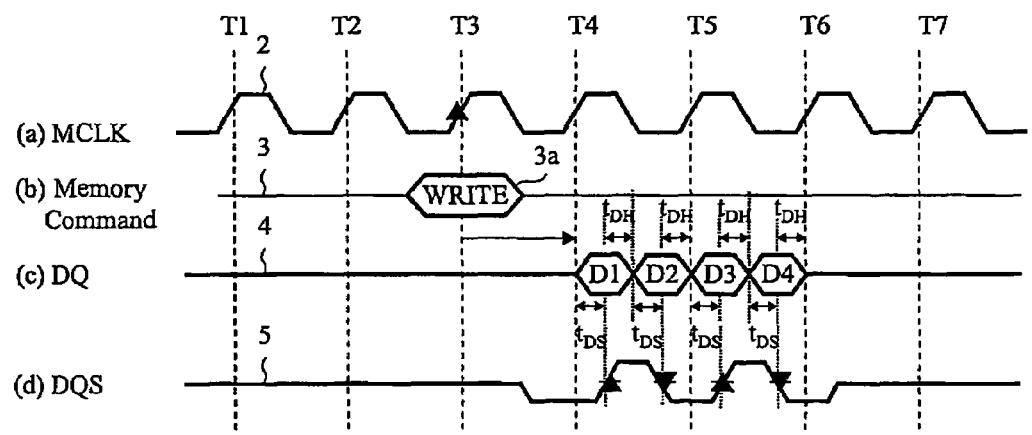
FIG. 6 is a view showing an operation in the conventional technology at a time of data transfer from the semiconductor device shown in FIG. 4 to a semiconductor memory, particularly at the time of data writing.

FIG. 4 depicts a configuration of a second embodiment of the present invention. The present system has a semiconductor device 10B with a memory interface 11, a semiconductor testing device 100 (also referred to as a semiconductor test system, for example) for general use in an electric test on a semiconductor, and a testing circuit 90 for the memory interface 11. In the present system and testing method, by a test signal outputted from the semiconductor testing device 100, a timing test on the memory interface 11 is performed by the testing circuit 90.

As with FIG. 2, the testing circuit 90 is connected to the semiconductor device 10B via transmission lines or the like. Also, the semiconductor device 10B and the semiconductor testing device 100 are connected via a signal line 101. Furthermore, the semiconductor testing device 100 and the testing circuit 90 are connected to each other via a signal line 102 and a signal line 103 for test signal. The devices (10B, 90, and 100) each have a terminal corresponding to its signal line (101 to 103). In particular, the semiconductor testing device 100 includes a testing terminal 104 that outputs a test signal (TEST) having the same function as that in the first embodiment.

Through the semiconductor testing device 100, the semiconductor device 10B is controlled by a signal (control signal) of the signal line 101 whilst the testing circuit 90 of the memory interface 11 is controlled by a signal (control signal) of the signal line 102.

The second embodiment is different from the first embodiment in that, instead of outputting a test signal (TEST) from the testing terminal 16 provided in the semiconductor device 10, a test signal is outputted from the testing terminal 104 provided in the semiconductor testing device 100. The semiconductor device 10B does not have to include the testing terminal 16. As with the first embodiment, the testing terminal 104 of the semiconductor testing device 100 outputs, apart from the memory command 3, a test signal for starting a test on the memory interface 11 by the testing circuit 90, without using the memory command 3 from the memory command terminal 13 of the semiconductor device 10B. Thereby, a timing test with restrictions on CL and others being satisfied is achieved between the testing circuit 90 and the semiconductor device 10B. The test operation and signals are similar to those in the first embodiment.

The semiconductor testing device 100 is a device having a function capable of easily generating a signal based on a file in which an H/L level generally called a test pattern is described with time. Therefore, there is an advantage in which timing of a test signal to be outputted in advance from the testing terminal 104 is easily adjustable even if the operation speed or the type of CL is changed so as to support the memory interface 11 of the semiconductor device 10B. Furthermore, since the testing terminal 16 is not required to be provided in the semiconductor device 10 itself, it is not required to newly design and/or manufacture a semiconductor device for achieving the test. Still further, since the memory interface 11 does not necessarily require a semiconductor testing device that operates at high speed with high timing precision, a timing test on the memory interface 11 can be achieved at high speed by using a semiconductor testing device with lower speed than that of the memory interface 11 or an already owned semiconductor testing device. Therefore, the effects similar to those in the first embodiment can be achieved.

In FIG. 4, the semiconductor testing device 100 and the testing circuit 90 of the memory interface 11 are shown as separate components. However, a configuration including the testing circuit 90 in the semiconductor testing device 100 may be also adopted. Also, as an example, the semiconductor testing device 100 generally used has been described. However, for example, there may be adopted such a configuration that control is performed by a microcomputer or the like, a test is performed by a testing circuit, the test results are transferred to the microcomputer, and then the test results are evaluated in the microcomputer.

Still further, a semiconductor device manufacturing method includes the steps of: performing a timing test on the memory interface 11 of the semiconductor device 10 or 10B through the above-described method; and determining the quality of the memory interface 11, that is, whether a restriction on CL and others are satisfied. With such a manufacturing method, capability of the semiconductor device can be ensured.

As described above, the invention made by the present inventors has been specifically described based on the embodiments. Needless to say, however, the present invention is not restricted to the embodiment described above and may be variously modified within the scope of not departing from the gist of the invention.

The present invention can be used for various semiconductor devices with memory interfaces, devices for testing the memory interfaces, and others.

What is claimed is:

1. A semiconductor device with a control function of a Double Data Rate (DDR) memory, the device comprising:
   a memory interface connectable to a DDR memory and including
      (i) a clock output terminal that outputs a single or differential clock,
      (ii) a data transceiving terminal that can transfer and receive data, and
      (iii) a first command output terminal that controls data writing and data reading to a DDR memory; and
   a memory interface test start signal output terminal that outputs, at an independent timing from a command signal outputted from the first command output terminal, a memory interface test start signal corresponding to the command signal,
   wherein, at a time of testing the memory interface, the first command output terminal does not output a signal, and the memory interface test start output terminal outputs the memory interface test start signal.

2. The semiconductor device according to claim 1, wherein the timing of the signal outputted at the memory interface test start signal output terminal is earlier than the signal outputted at the first command output terminal.

3. The semiconductor device according to claim 2, wherein, at a time of a test on the interface connectable with the DDR memory, a signal corresponding to the command signal is outputted from the memory interface test start signal output terminal.

4. The semiconductor device according to claim 2, wherein the interface connectable with the DDR memory further includes a data strobe input/output terminal that transfers and receives a signal for determining data timing from the data transceiving terminal.

5. The semiconductor device according to claim 1, wherein, at a time of a test on the interface connectable with the DDR memory, a signal corresponding to the command signal is outputted from the memory interface test start signal output terminal.

6. The semiconductor device according to claim 1, wherein the interface connectable with the DDR memory further includes a data strobe input/output terminal that transfers and receives a signal for determining data timing from the data transceiving terminal.

7. A method of testing a semiconductor device with a control function of a Double Data Rate (DOR) memory and a DDR memory interface,
   wherein the DDR memory interface includes: a clock output terminal that outputs a single or differential clock; a data transceiving terminal that can transfer and receive data; and a first command output terminal that controls data writing and data reading to a DDR memory,
   wherein, in a first mode in which a memory write command is outputted from the first command output terminal and a signal about memory writing is outputted from the data transceiving terminal, a signal outputted from a second command terminal that outputs a signal corresponding to the command signal, at a different timing than a command signal from the first command output terminal, is received, thereby performing a test on the DDR memory interface, and
   wherein, without using or outputting an output signal of the first command output terminal, the test on the DDR memory interface is performed by an output signal of the second command input signal.

8. The method of testing a semiconductor device according to claim 7,
   wherein the memory interface having a control function of a DDR memory of the semiconductor device further includes a data strobe terminal that exchanges a data strobe signal for establishing timings of input and output of the data, and
   in a configuration in which a testing circuit is connected to the semiconductor device, the method further comprising the steps of:
   outputting, from the semiconductor device, a test signal from the second command output terminal at timing in which a restriction on latency is satisfied;
   receiving, by the testing circuit, the signal outputted from the second command terminal, and outputting the data signal and the data strobe signal, which correspond to read data, to the semiconductor device; and
   receiving, by the semiconductor device, the data signal and the data strobe signal from the testing circuit, and capturing the read data from the data signal in accordance with the data strobe signal.

9. The method of testing a semiconductor device according to claim 7,
   wherein in a configuration in which a testing circuit, which is connected to the semiconductor device and performs a test of the memory interface, and a semiconductor testing device, different from the testing circuit, which are connected,
   a command terminal for testing is provided between the semiconductor testing device and the testing circuit, the command terminal for testing transmits to the testing circuit, at an independent timing from a command signal outputted from the first command output terminal, a signal corresponding to the command signal, and the testing circuit, upon receiving the signal, performs a test on the memory interface of the semiconductor device.

10. A method of testing a semiconductor device according to claim 9, wherein, at a time of a test on the interface connectable with the DDR memory, a signal corresponding to the command signal is outputted from the command terminal for testing.

11. A method of testing a semiconductor device with a control function of a Double Data Rate (DDR) memory and a DDR memory interface including a clock output terminal that outputs a single or differential clock, a data transceiving terminal that can transfer and receive data, and a first command output terminal that controls data writing and data reading to a DDR memory, the method comprising the steps of:

in a second mode in which a memory read command is outputted from the first command output terminal and a signal about memory reading is inputted by the data transceiving terminal, a signal outputted from a second command terminal that outputs a signal corresponding to the command signal, at a different timing than a command signal from the first command output terminal, is received, thereby performing a test on the DDR memory interface, wherein, without using or outputting an output signal of the first command output terminal, the test on the DDR memory interface is performed by an output signal of the second command input signal.

12. The method of testing a semiconductor device according to claim 11, wherein the memory interface having a control function of a DDR memory of the semiconductor device further includes a data strobe terminal that exchanges a data strobe signal for establishing timings of input and output of the data, and in a configuration in which a testing circuit is connected to the semiconductor device, the method further comprising the steps of:

outputting, from the semiconductor device, a test signal from the second command output terminal at timing in which a restriction on latency is satisfied;

receiving, by the testing circuit, the signal outputted from the second command terminal, and outputting the data signal and the data strobe signal, which correspond to read data, to the semiconductor device; and receiving, by the semiconductor device, the data signal and the data strobe signal from the testing circuit, and capturing the read data from the data signal in accordance with the data strobe signal.

* * * * *